(12) United States Patent
Lin

(10) Patent No.: US 11,910,723 B2
(45) Date of Patent: Feb. 20, 2024

(54) MEMORY DEVICE WITH ELECTRICALLY PARALLEL SOURCE LINES

(71) Applicant: Taiwan Semiconductor Manufacturing Company, Ltd., Hsinchu (TW)

(72) Inventor: Ku-Feng Lin, New Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 380 days.

(21) Appl. No.: 17/032,638

(22) Filed: Sep. 25, 2020

(65) Prior Publication Data

US 2021/0135093 A1 May 6, 2021

Related U.S. Application Data

(60) Provisional application No. 62/928,645, filed on Oct. 31, 2019.

(51) Int. Cl.
*H10N 50/80* (2023.01)
*G11C 11/16* (2006.01)
(Continued)

(52) U.S. Cl.
CPC ......... *H10N 50/80* (2023.02); *G11C 11/1655* (2013.01); *G11C 11/1657* (2013.01); *H10B 61/22* (2023.02); *H10N 50/01* (2023.02)

(58) Field of Classification Search
CPC ........ H10N 50/80; H10N 50/01; H10B 61/22; G11C 11/1655; G11C 11/1657
(Continued)

(56) References Cited

U.S. PATENT DOCUMENTS 3,863,229 A * 1/1975 Gersbach ............... H03K 3/352
365/156
5,371,707 A * 12/1994 Ogawa ................ G11C 11/4099
365/208

(Continued)

FOREIGN PATENT DOCUMENTS

| CN | 104282327 A | 1/2015 |
| CN | 107180650 A | 9/2017 |

(Continued)

OTHER PUBLICATIONS

Chinese Office Action for Application No. 202011196376.6 dated Nov. 14, 2023.

*Primary Examiner* — Jami Valentine Miller
(74) *Attorney, Agent, or Firm* — Merchant & Gould P.C.

(57) ABSTRACT

A memory device includes a memory cell array having a plurality of memory cells arranged in rows and columns, each row of memory cells being associated with a word line, each column of memory cells being associated with a bit line and a source line. Each memory cell includes: a storage device coupled to the bit line, the storage device being selectable between a first resistance state and a second resistance state in response to a bit line signal at the bit line; and a selection device connected in series with the storage device and coupled to the source line, the selection device being configured to provide access to the storage device in response to a word line signal at the word line. The memory device further includes a word-line driver and a bit-line driver. A first number of the source lines are connected in parallel.

20 Claims, 8 Drawing Sheets

(51) Int. Cl.
*H10B 61/00* (2023.01)
*H10N 50/01* (2023.01)

(58) Field of Classification Search
USPC .......................................................... 257/421
See application file for complete search history.

(56) References Cited

U.S. PATENT DOCUMENTS

| | | | |
|---|---|---|---|
| 7,286,395 | B2 | 10/2007 | Chen et al. |
| 7,436,699 | B2* | 10/2008 | Tanizaki ................. G11C 11/16 365/158 |
| 7,835,173 | B2 | 11/2010 | Ma et al. |
| 9,007,818 | B2 | 4/2015 | Sandhu et al. |
| 9,620,190 | B2 | 4/2017 | Lee et al. |
| 9,747,979 | B2* | 8/2017 | Nakayama .......... G11C 11/1673 |
| 9,852,783 | B1 | 12/2017 | Na et al. |
| 10,008,662 | B2 | 6/2018 | You et al. |
| 10,134,459 | B2 | 11/2018 | Toh et al. |
| 2002/0172068 | A1* | 11/2002 | Hidaka ................... G11C 11/15 365/100 |
| 2004/0076029 | A1* | 4/2004 | Jeong ...................... G11C 11/16 365/50 |
| 2005/0036361 | A1* | 2/2005 | Fukuzumi ............. H10B 61/22 365/158 |
| 2013/0051134 | A1* | 2/2013 | Kawahara ........... G11C 11/1675 365/158 |
| 2014/0085964 | A1* | 3/2014 | Nakano ................ G11C 13/004 365/148 |
| 2014/0347919 | A1* | 11/2014 | Aoki .................... G11C 11/1673 365/158 |
| 2017/0033161 | A1 | 2/2017 | Tasi et al. |
| 2019/0051348 | A1 | 2/2019 | Disegni et al. |
| 2021/0091304 | A1* | 3/2021 | Endoh .................... H10N 50/85 |
| 2023/0106065 | A1* | 4/2023 | Onuki .................... H10N 50/80 257/421 |

FOREIGN PATENT DOCUMENTS

| | | |
|---|---|---|
| CN | 109300933 A | 2/2019 |
| CN | 105977376 B | 7/2019 |
| JP | 5460606 B2 | 1/2014 |
| KR | 10-2008-0061407 A | 7/2008 |
| KR | 10-2011-0090980 A | 8/2011 |
| KR | 10-2014-0139539 A | 12/2014 |
| KR | 10-2019-0053854 A | 5/2019 |
| TW | 201933353 A | 8/2019 |
| WO | 2009/067141 A1 | 5/2009 |

* cited by examiner

MEMORY DEVICE WITH ELECTRICALLY PARALLEL SOURCE LINES

CROSS-REFERENCE TO RELATED APPLICATION

This application claims priority to U.S. Provisional Patent Application No. 62/928,645, filed Oct. 31, 2019, the disclosure of which is hereby incorporated by reference in its entirety.

BACKGROUND

Memory devices are used to store information in semiconductor devices and systems. A nonvolatile memory device is capable of retaining data even after power is cut off. Examples of nonvolatile memory devices include flash memory, ferroelectric random access memories (FRAMs), magnetic random access memories (MRAMs), resistive random access memories (RRAMs), and phase-change memories (PCMs). MRAM, RRAM, FRAM, and PCM are sometimes referred to as emerging memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
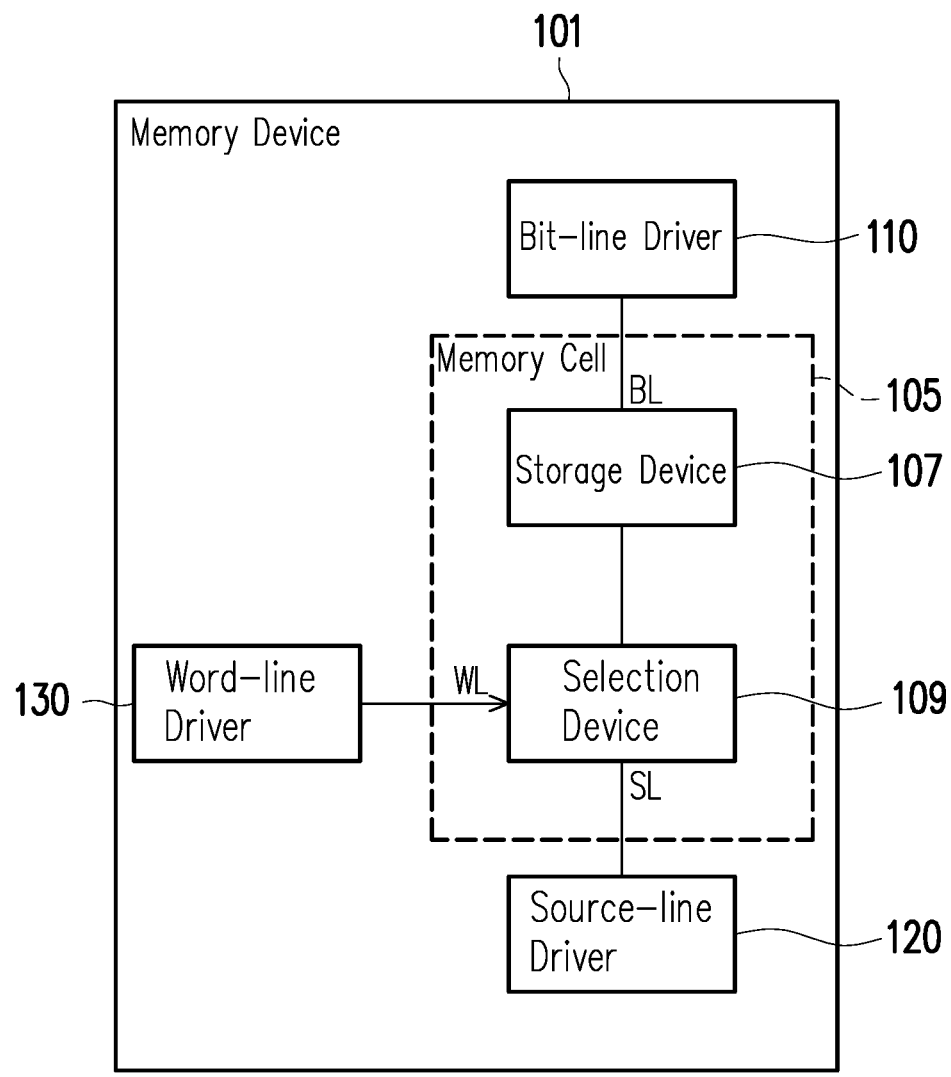
FIG. 1 is a block diagram illustrating an example memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a memory device, bottom metal tracks that carry source line signals typically are thinner with a smaller pitch as compared with upper metal tracks that carry bit line signals. Thus, metal tracks that carry source line signals have higher sheet resistance (i.e., resistivity divided by film thickness) than metal tracks that carry bit line signals do. The unbalance between bit lines and source lines results in different read currents for memory cells in the same column.

In accordance with some aspects of the present disclosure, multiple source line metal tracks are connected in parallel to reduce sheet resistance, thus improving the balance between bit lines and source lines. In some examples, the multiple source line metal tracks connected in parallel correspond to different columns of memory cells. As a result, when two different memory cells in the same column are selected by different word line signals, the read currents sensed are close to each other. The number of source line metal tracks to be connected in parallel can be determined based on the sheet resistance of the bit line metal track and the sheet resistance of the source line metal track.

FIG. 1 is a block diagram illustrating an example memory device 101 in accordance with some embodiments. In the example shown, the example memory device 101 includes, among other things, a memory cell 105, a word line driver 130, a bit line driver 110, and a source line driver 120.

The memory cell 105 further includes, among other things, a storage device 107 and a selection device 109. In some embodiments, the storage device may be magneto-resistive materials for MRAMs. In some embodiments, the storage device may be resistive materials for RRAMs. In some embodiments, the storage device may be phase-change materials for PCMs. In some embodiments, the storage device may be capacitors for DRAMs. Other memory types are within the scope of the disclosure.

The memory cell 105 is one example of a plurality of memory cells 105 which form a memory cell array. For simplicity, only the memory cell 105 is shown in FIG. 1; a typical memory cell array would include many more memory cells. The plurality of memory cells may be arranged within the memory cell array in rows and/or columns. Memory cells 105 within a row of the memory cell array are operably coupled to a word line (WL), while memory cells 105 within a column of the memory cell array are operably coupled to a bit line (BL) and a corresponding source line (SL). The plurality of memory cells 105 are respectively associated with an address defined by an intersection of a word line (WL) and a bit line (BL).

As stated above, the memory cell 105 includes the storage device 107 and the selection device 109. The word line driver 130 generates a word line (WL) signal based on a word line address. The word line (WL) signal is provided to the selection device 109. The selection device 109 is selectively turned on or turned off based on the word line (WL) signal. In some embodiments, the selection device 109 is an n-type selection device. In some examples, the selection device 109 is an n-type filed-effect transistor (FET). The selection device 109 is turned on when the word line (WL) signal is at logical high (i.e., "1") and turned off when the word line (WL) signal is at logical low (i.e., "0"). In some embodiments, the selection device 109 is a p-type selection device. In some examples, the selection device 109 is a p-type FET. The selection device 109 is turned on when the word line (WL) signal is at logical low and turned off when the word line (WL) signal is at logical high.

The storage device 107 is coupled to a bit line connected to the bit line driver 110. The selection device 109 is coupled to a source line connected to the source line driver 120. By activating the word line, the selection device 119 is turned on, allowing for the source line to be coupled to the storage device 107. As such, the storage device 107 is coupled between its corresponding bit line and source line when activating the word line. The storage device 107 has a resistance state that is switchable between a low resistance state and a high resistance state. The resistance states are indicative of a data value (e.g., a "1" or "0") stored within the storage device 107.

By selectively applying signals to word lines, bit lines, and source lines of the memory cell array, forming, set, reset, and read operations may be performed on the selected ones (e.g., the memory cell 105) of the plurality of memory cells. For example, in a write operation, a write current flows through the storage device 107, causing the storage device 107 to switch from the low resistance state to the high resistance state or vice versa, whereby a bit of data is written and stored in the memory cell 105. On the other hand, in a read operation, a read current flows through the storage device 107, and the read current corresponds to either the high resistance state or the low resistance state of the storage device 107. A sense amplifier (not shown) may compare the read current to a reference current to sense the bit of data stored in the memory cell 105. The sense amplifier amplifies a level of the sensed bit of data and outputs the amplified bit of data such that the bit of data stored in the memory cell 105 can be read therefrom.

Figure 2:
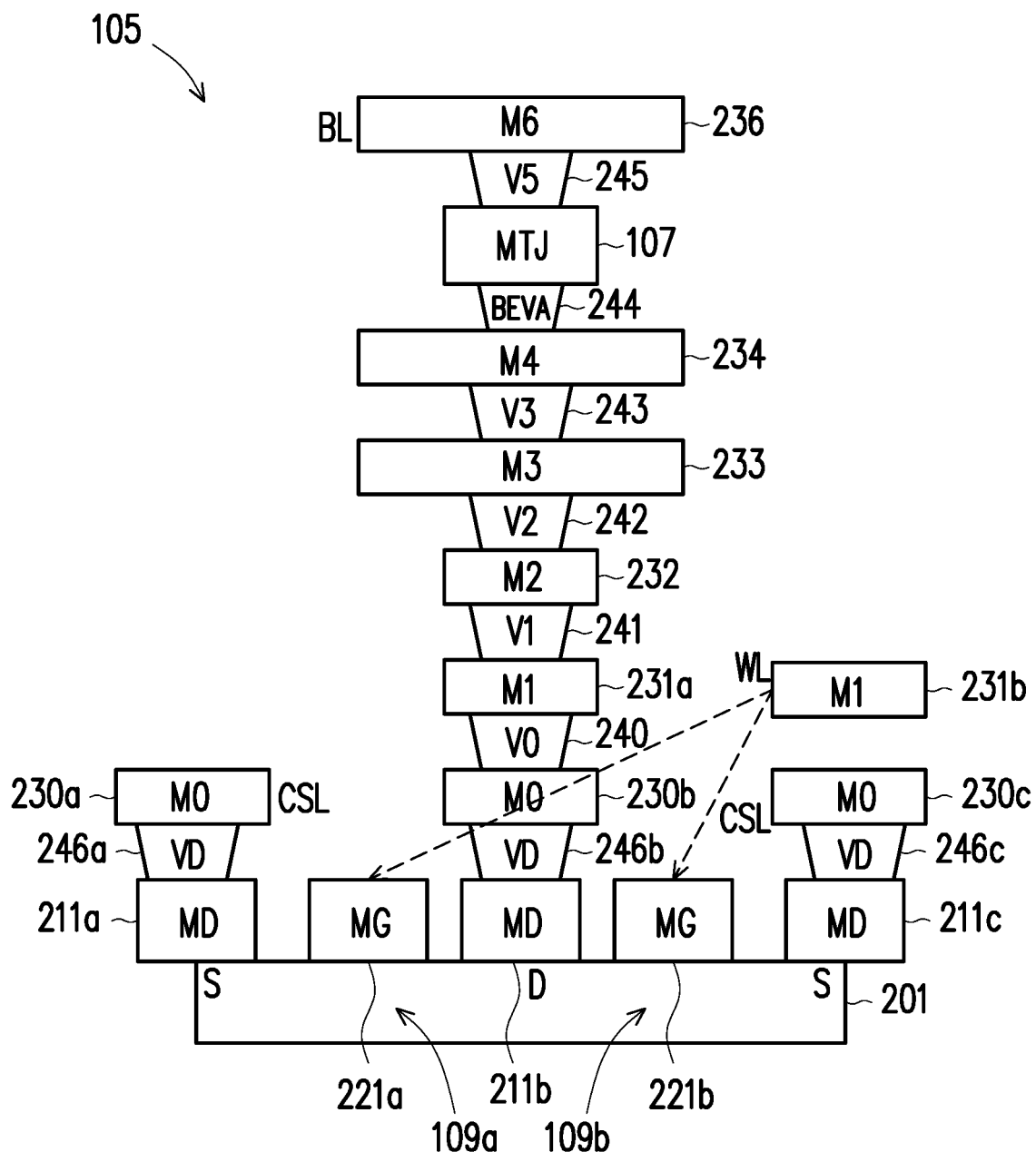
FIG. 2 is a cross-sectional diagram illustrating a memory cell of FIG. 1 in accordance with some embodiments.

FIG. 2 is a cross-sectional diagram illustrating a memory cell 105 of FIG. 1 in accordance with some embodiments. In the illustrated example, the memory cell 105 includes a storage device 107 and two selection devices 109a and 109b. Specifically, the storage device 107 is a magnetic tunnel junction (MTJ) 107, while the two selection devices 109a and 109b are two transistors 109a and 109b, though other devices might be employed as well.

Magnetic random access memories (MRAMs) have two or more resistance states depending on the state of magnetization alignment between two or more layers of magnetic materials, such as ferromagnetic materials. The resistance of a memory cell can be compared to a reference to determine the resistance state of the memory cell. More particularly, MRAMs store data at memory cells having two superimposed layers of magnetic material separated by a thin insulating film. The layered structure forms an MTJ of an MRAM cell. The two layers include a magnetic layer that is permanently magnetized in a fixed magnetic field alignment direction (this layer is referred to as a "pinned layer") and a changeably-magnetized magnetic layer (this layer is referred to as a "free layer"). The free layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel) or opposite to that of the permanent magnet layer (anti-parallel). The parallel alignment state has a relatively lower resistance and the anti-parallel alignment state has a higher resistance.

In the illustrated example, the MTJ 107 is vertically connected to a metal track M6 236 above the MTJ 107 through a vertical interconnect access (via) V5 245. The MTJ 107 is vertically connected to a metal track M4 234 below the MTJ 107 through a bottom electrode via (BEVA) 244. The BEVA 244 is used to carry morphology to the MTJ 107. The metal track 234 is further vertically connected to a metal track M3 233 through a via V3 243. The metal track M3 233 is further vertically connected to a metal track M2 232 through a via V2 242. The metal track M2 232 is further vertically connected to a metal track M1 231a through a via V1 241. The metal track M1 231a is further vertically connected to a metal track M0 230a through a via V0 240. The metal track M0 230a is further vertically connected a metal contact (MD) track MD 211b through a via VD 246b.

The transistors 109a and 109b are disposed in an active region 201. For the transistor 109a, a gate contact (MG) track 221a serves as a gate contact, a metal contact track 211a serves as a source contact, and the metal contact track 211b serves as a drain contact. For the transistor 109b, a gate contact track 221b serves as a gate contact, a metal contact track 211c serves as a source contact, and the metal contact track 211b serves as a drain contact. As such, the MTJ 107 is connected to the transistors 109a and 109b. The metal contact track 211a is vertically connected to a metal track M0 230a through a via VD 246a. Likewise, the metal contact track 211c is vertically connected to a metal track M0 230c through a via VD 246c.

In the illustrated example, a word line signal is applied to the metal track M1 231b. The metal track M1 231b is connected to the gate contact tracks 221a and 221b through connection paths not shown. As such, the word line signal applied to the metal track M1 231b can selectively turn on or turn off the transistors 109a and 109b based on the word line signal.

A bit line signal is applied to the metal track 236. When the transistors 109a and 109b are turned on, a read current flows through the metal track M6 236, the MTJ 107, the transistor 109a/109b to the metal track M0 230a/230c. As such, source line signals can be sensed on the metal track M0 230a or the metal track 230c by comparing the read current with a reference current.

However, bottom metal tracks (e.g., the M0 metal tracks 230a, 230b, and 230c) are thinner with a smaller pitch compared with upper metal tracks (e.g., the metal track 236). Thus, metal tracks (e.g., 230a and 230c) that carry source line signals have higher sheet resistance than metal tracks (e.g., 236) that carry bit line signals do. When two different memory cells 105 in the same column are selected by different word line signals, the read currents sensed are different (i.e., unbalanced) due to the difference in sheet resistance (i.e., unbalance between bit lines and source lines). Specifically, although the sum ($L_{B1}+L_{S1}$) of the length ($L_{B1}$) of the bit line metal track and the length ($L_{S1}$) of the source line metal track for the first memory cell 105 is equal to the sum ($L_{B2}+L_{S2}$) of the length ($L_{B2}$) of the bit line metal track and the length ($L_{S2}$) of the source line metal track for the second memory cell 105, the read currents sensed are different because $L_{B1}$ is different from $L_{B2}$ while $L_{S1}$ is different from $L_{S2}$. In summary, the unbalance between bit lines and source lines results in different read currents for memory cells in the same column.

In accordance with disclosed aspects, multiple source line metal tracks corresponding to different columns of memory cells 105 can be connected in parallel to reduce sheet resistance, thus improving the balance between bit lines and source lines. As a result, when two different memory cells 105 in the same column are selected by different word line signals, the read currents sensed are close to each other. The number of source line metal tracks to be connected in parallel can be determined in accordance to a method described below with reference to FIG. 3.

Figure 3:
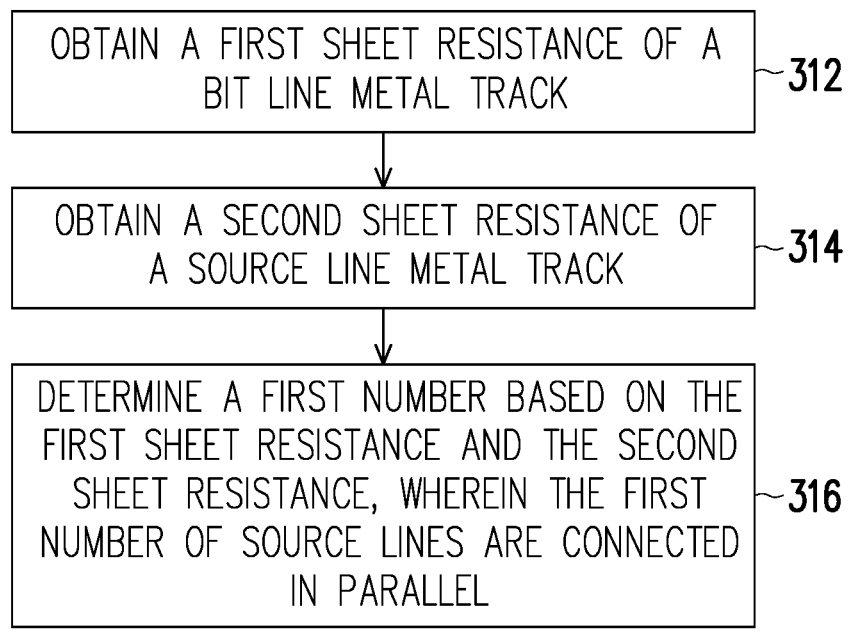
FIG. 3 is a flow chart illustrating a method for determining the number of source line metal tracks to be connected in parallel in accordance with some embodiments.

FIG. 3 is a flow chart illustrating a method for determining the number of source line metal tracks to be connected in accordance with some embodiments. In the illustrated flow chat, at step 312, a first sheet resistance (R1) of a bit line metal track is obtained. In one example, R1 is the sheet resistance of the metal track M6 236 and R1 is 844 ohm. At step 314, a second sheet resistance (R2) of a source line metal track is obtained. In one example, R2 is the sheet resistance of the metal track 230a and R2 is 6877 ohm. At step 316, the first number (N) of source lines that are connected in parallel is determined based on the first sheet resistance (R1) and the second sheet resistance (R2). In one example, N is determined to be the greatest integer less than or equal to (R2/R1). Thus, in the example where R1 is 844 ohm and R2 is 6877 ohm, N is determined to be 8. In other words, eight source line metal tracks are connected in parallel, and the equivalent sheet resistance becomes 859.6 ohm (i.e., R2/N; one eighth of 6877 ohm), which is close to R1 (i.e., 844 ohm). As such, the balance between bit lines and source lines are improved.

Figure 4:
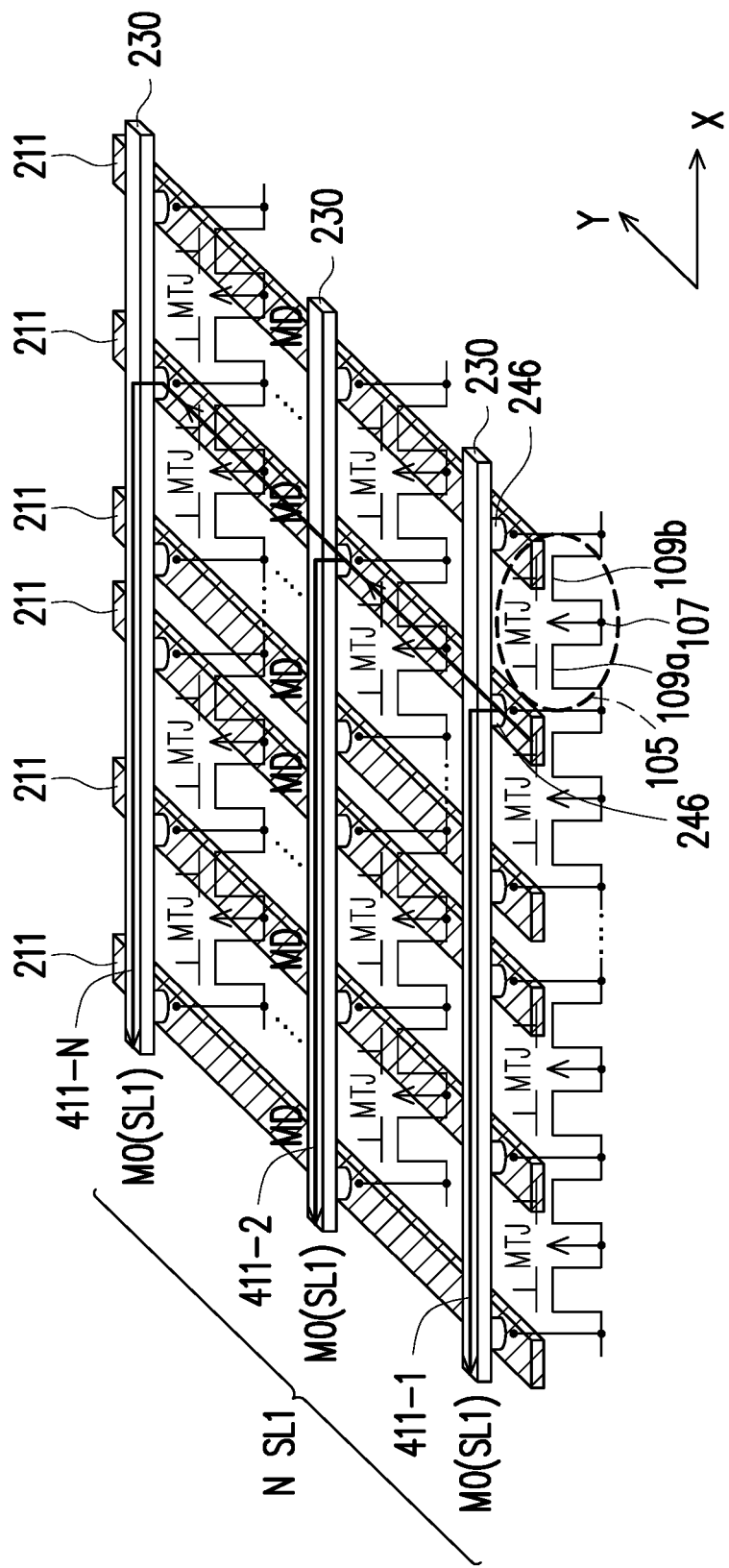
FIG. 4 is a structure diagram illustrating source line metal tracks connected in parallel in accordance with some embodiments.

FIG. 4 is a structure diagram illustrating source line metal tracks connected in parallel in accordance with some embodiments. In this illustrated example, multiple (i.e., a positive integer N) source line metal tracks 230 are connected. Specifically, the exemplary memory device includes, among other things, memory cells 105 arranged in an array. Each memory cell 105 includes, among other things, a MTJ 107 as a storage device and two transistors 109a and 109b as selection devices. A word line signal selectively turns on or turns off the transistors 109a and 109b. By applying a bit line signal, a read current flows through the MTJ 107 and can be sensed on a source line metal track 230.

In this illustrated example, source line metal tracks 230 are metal tracks M0 230 as shown in FIG. 2. Source line metal tracks 230 extend in an X direction, and are connected in parallel by means of metal contact tracks MD 211 as shown in FIG. 2 extending in a Y direction. In one example, the Y direction is perpendicular to the X direction. In the illustrated example, the source line metal tracks 230 are above the metal contact tracks MD 211, and the multiple (i.e., N) source line metal tracks 230 are connected to every metal contact tracks MD 211 through vias VD 246. As such, the multiple (i.e., N) source line metal tracks 230 are connected in parallel.

When a read current flows to a metal contact track 211, there are multiple (i.e., N) current paths 411-1 to 411-N. The multiple (i.e., N) current paths 411-1 to 411-N reduce source line resistance, thus improving the balance between source lines and bit lines.

The number (N) of source line metal tracks 230 and the number of the metal contact tracks MD 211 are just for illustration. In one example, the number (N) of source line metal tracks 230 is eight. In another example, the number (N) of source line metal tracks 230 is two. In one example, the number of the metal contact tracks MD 211 is 512. Other numbers of metal contact tracks are within the scope of this disclosure.

Figure 5:
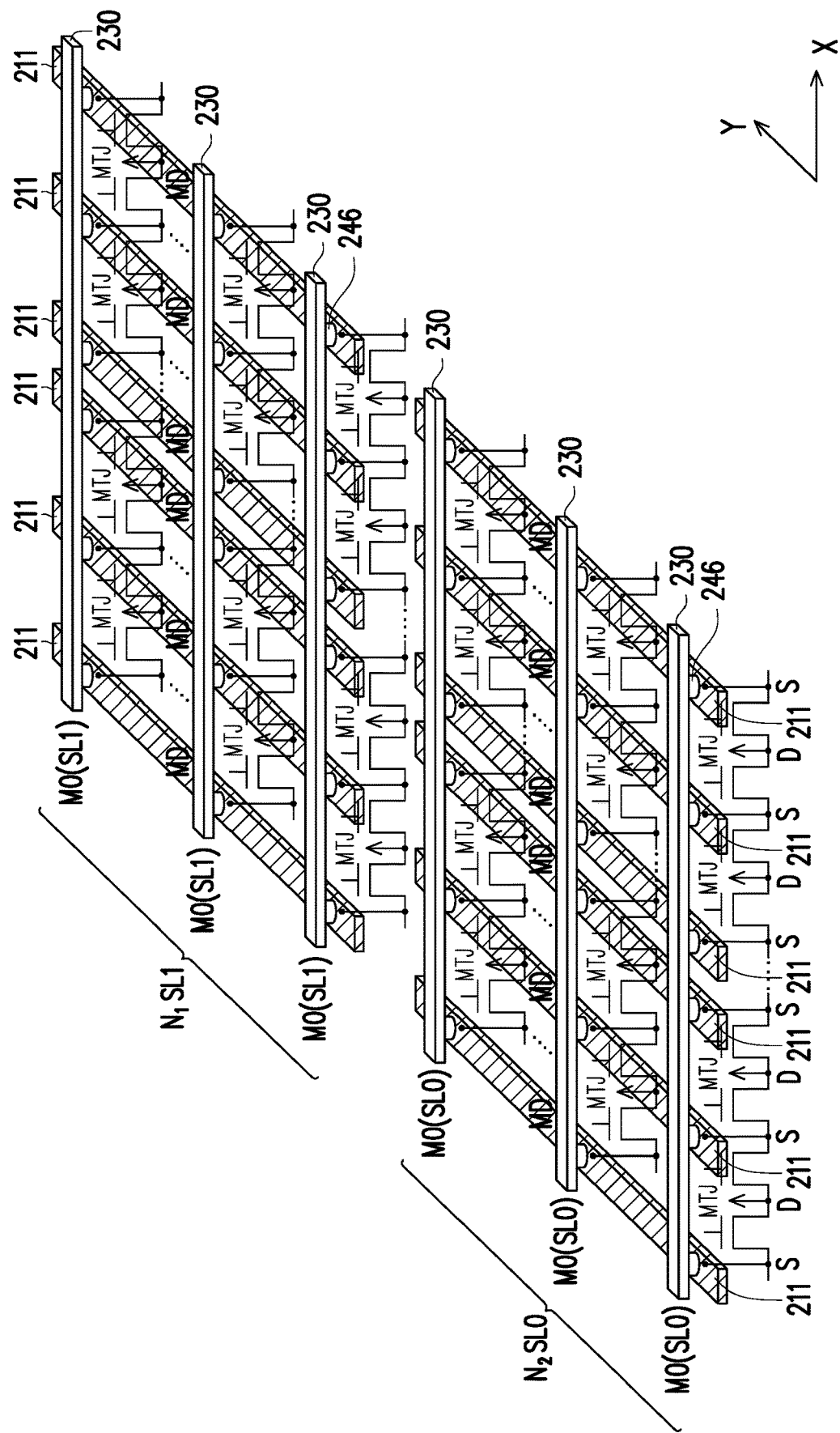
FIG. 5 is a structure diagram illustrating source line metal tracks connected in parallel in accordance with some embodiments.

FIG. 5 is a structure diagram illustrating source line metal tracks connected in parallel in accordance with some embodiments. In this illustrated example, multiple (i.e., $N_1+N_2$) source line metal tracks 230 are divided into multiple (e.g., two) groups and source line metal tracks 230 in each group are connected. Specifically, one group of source line metal tracks 230 has multiple (i.e., $N_1$) source line metal tracks 230 connected, and the other group of source line metal tracks 230 has multiple (i.e., $N_2$) source line metal tracks 230 connected.

In this illustrated example, source line metal tracks 230 are metal tracks M0 230 as shown in FIG. 2. Source line metal tracks 230 extend in an X direction, and are connected in parallel, within each group, by means of metal contact tracks MD 211 as shown in FIG. 2 extending in a Y direction. In one example, the Y direction is perpendicular to the X direction. The source line metal tracks 230 are above the metal contact tracks MD 211, and the multiple (i.e., $N_1$ or $N_2$) source line metal tracks 230 within each group are connected to every metal contact tracks MD 211 through vias VD 246. As such, the multiple (i.e., $N_1$ or $N_2$) source line metal tracks 230 within each group are connected in parallel.

When a read current flows to a metal contact track MD 211, there are multiple (i.e., $N_1$ or $N_2$) current paths (not shown). The multiple (i.e., $N_1$ or $N_2$) current paths reduce source line resistance, thus improving the balance between source lines and bit lines.

The number (i.e., $N_1$ or $N_2$) of source line metal tracks 230 within each group and the number of the metal contact tracks MD 211 within each group are just for illustration. In one example, the number ($N_1$) of source line metal tracks 230 within the first group is eight, the number of the metal contact tracks MD 211 within the first group is 512; the number ($N_2$) of source line metal tracks 230 within the second group is eight, and the number of the metal contact tracks MD 211 within the second group is 512. In another example, the number ($N_1$) of source line metal tracks 230 within the first group is eight, the number of the metal contact tracks MD 211 within the first group is 512; the number ($N_2$) of source line metal tracks 230 within the second group is two, and the number of the metal contact tracks MD 211 within the second group is eight. Moreover, the number of groups is not limited to two groups. In one example, the number of groups is five. Other numbers of metal contact tracks and groups are within the scope of this disclosure.

Figure 6:
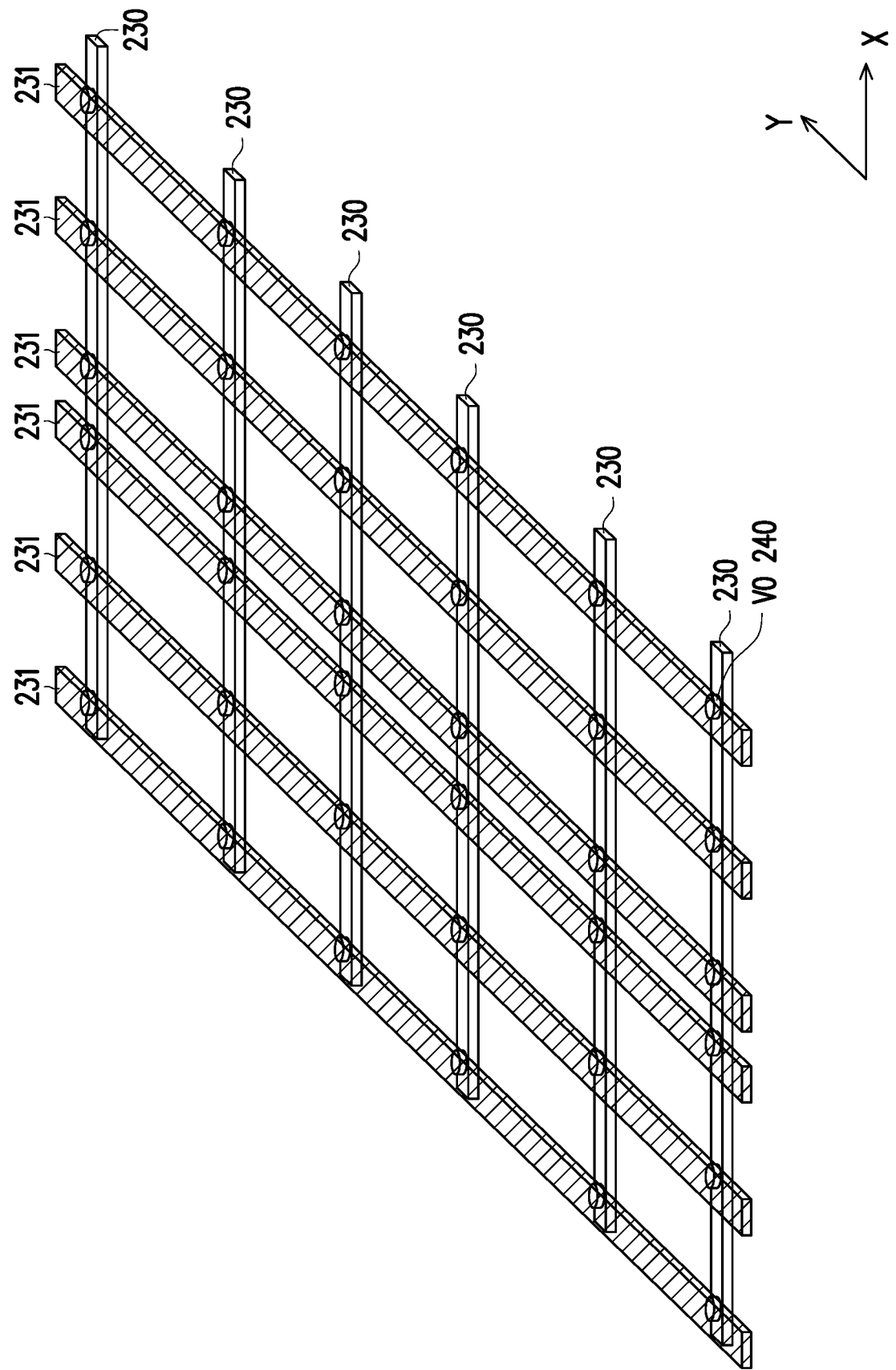
FIG. 6 is a structure diagram illustrating source line metal tracks connected in parallel in accordance with some embodiments.

FIG. 6 is a structure diagram illustrating source line metal tracks connected in parallel in accordance with some embodiments. In this illustrated example, source line metal tracks are connected in parallel by metal tracks above, rather than below, the source line metal tracks.

Specifically, multiple (i.e., N) source line metal tracks 230 are connected. Source line metal tracks 230 are metal tracks M0 230 as shown in FIG. 2. Source line metal tracks 230 extend in an X direction, and are connected in parallel by means of metal tracks M1 231 as shown in FIG. 2 extending in a Y direction. In one example, the Y direction is perpendicular to the X direction. The source line metal tracks 230 are below the metal tracks M1 231, and the multiple (i.e., N) source line metal tracks 230 are connected to every metal tracks M1 231 through vias V0 240 as shown in FIG. 2. As such, the multiple (i.e., N) source line metal tracks 230 are connected in parallel.

When a read current flows to a metal track M1 231, there are multiple (i.e., N) current paths. The multiple (i.e., N) current paths reduce source line resistance, thus improving the balance between source lines and bit lines.

Likewise, the specific number (N) of source line metal tracks 230 and the number of the metal tracks M1 231 shown in the drawings are for illustration. In one example, the number (N) of source line metal tracks 230 is eight. In another example, the number (N) of source line metal tracks 230 is two. In one example, the number of the metal tracks M1 231 is 512. Other numbers of metal tracks are within the scope of the disclosure.

Figure 7:
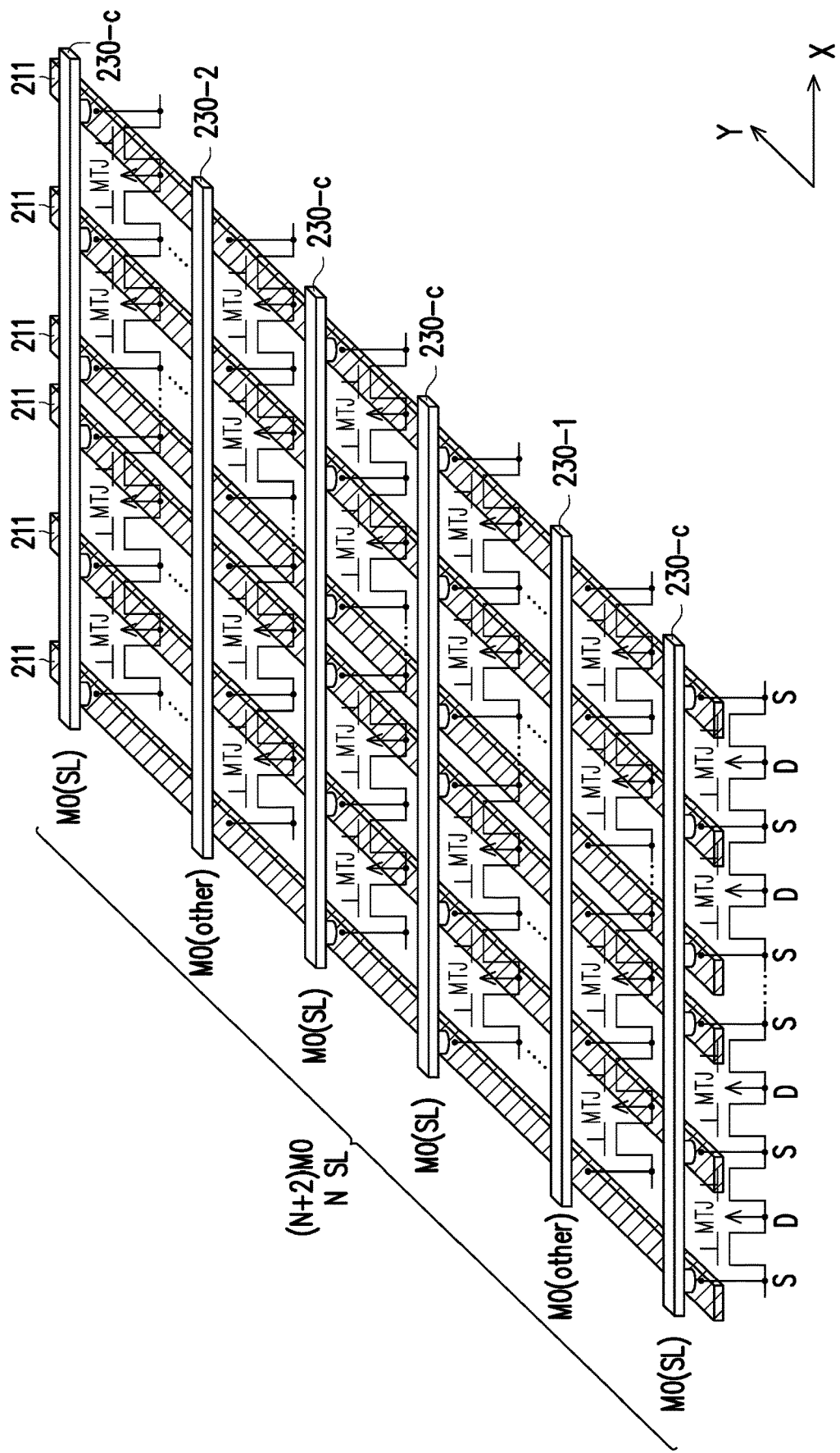
FIG. 7 is a structure diagram illustrating source line metal tracks connected in parallel in accordance with some embodiments.

FIG. 7 is a structure diagram illustrating source line metal tracks connected in parallel in accordance with some embodiments. In this illustrated example, source line metal tracks that are connected in parallel by means of metal tracks are not necessarily adjacent to each other.

Specifically, multiple (i.e., N+2) source line metal tracks 230 are connected. Source line metal tracks 230 are metal tracks M0 230 as shown in FIG. 2. Source line metal tracks 230 extend in an X direction. Among those source line metal tracks 230, there are multiple (i.e., N) source line metal tracks 230-*c* that are connected in parallel and two source line metal tracks 230-1 and 230-2 that are not connected. The N source line metal tracks 230-*c* are connected in parallel by means of metal contact tracks MD 211 as shown in FIG. 2 extending in a Y direction. In one example, the Y direction is perpendicular to the X direction. The N source line metal tracks 230-*c* are above the metal contact tracks MD 211 and connected to every metal contact tracks MD 211 through vias VD 246 as shown in FIG. 2. As such, the N source line metal tracks 230-*c* are connected in parallel. The N source line metal tracks 230-*c* are not necessarily adjacent to each other.

When a read current flows to a metal contact track MD 211, there are multiple (i.e., N) current paths (not shown). The multiple (i.e., N) current paths reduce source line resistance, thus improving the balance between source lines and bit lines.

Likewise, the specific number (N) of source line metal tracks 230-*c* and the number of the metal contact tracks MD 211 are for illustration. In one example, the number (N) of source line metal tracks 230-*c* is eight. In another example, the number (N) of source line metal tracks 230-*c* is two. In one example, the number of the metal contact tracks MD 211 is 512. Other numbers of metal contact tracks are within the scope of the disclosure.

Figure 8:
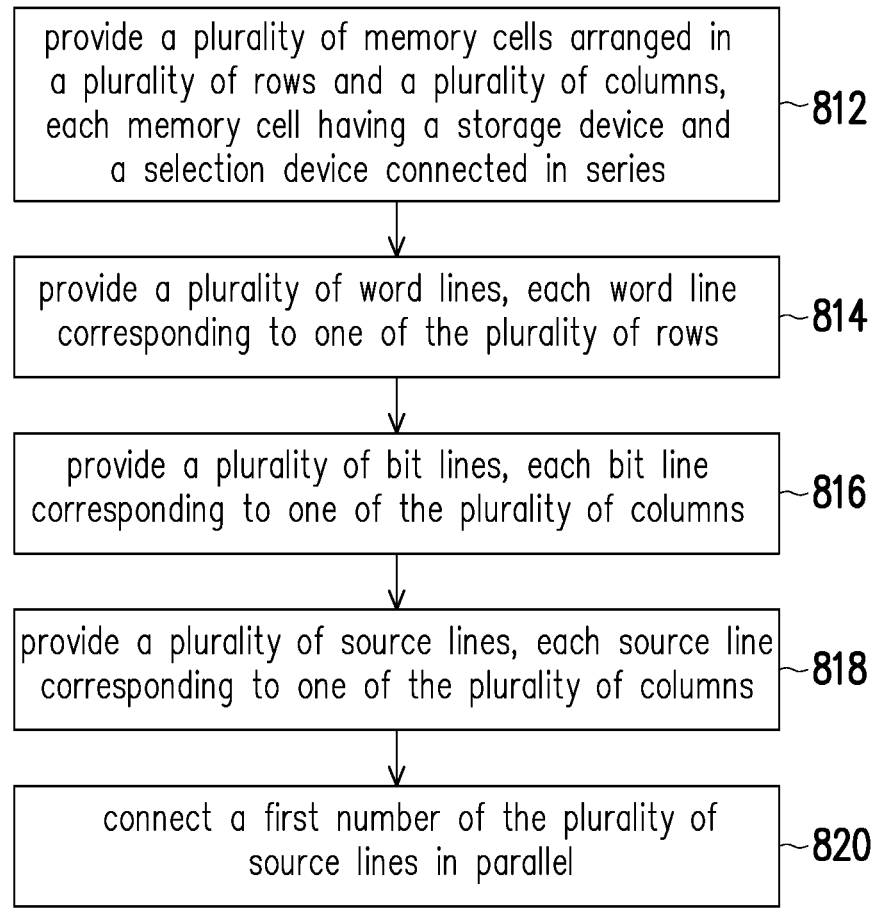
FIG. 8 is a flow chart illustrating a method in accordance with some embodiments.

FIG. 8 is a flow chart illustrating a method in accordance with some embodiments. At step 812, a plurality of memory cells are provided. The plurality of memory cells are arranged in a plurality of rows and a plurality of columns. Each memory cell has a storage device and a selection device connected in series. At step 814, a plurality of word lines are provided. Each word line corresponds to one of the plurality of rows. At step 816, a plurality of bit lines are provided. Each bit line corresponds to one of the plurality of columns. At step 818, a plurality of source lines are provided. Each source line corresponds to one of the plurality of columns. At step 820, a first number of the plurality of source lines are connected in parallel. In some embodiments, the first number is determined based on a first sheet resistance associated with the plurality of bit lines and a second sheet resistance associated with the plurality of source lines.

In accordance with some disclosed embodiments, a memory device is provided. The memory device includes a memory cell array having a plurality of memory cells arranged in a plurality of rows and a plurality of columns, each row of memory cells being associated with a word line, each column of memory cells being associated with a bit line and a source line. Each memory cell includes: a storage device coupled to the bit line, the storage device being selectable between a first resistance state and a second resistance state in response to a bit line signal at the bit line; and a selection device connected in series with the storage device and coupled to the source line, the selection device being configured to provide access to the storage device in response to a word line signal at the word line. The memory device further includes a word-line driver coupled to the word line and configured to generate the word line signal; and a bit-line driver coupled to the bit line and configured to generate the bit line signal. A first number of the source lines are connected in parallel.

In accordance with some disclosed embodiments, a method is provided. The method includes: providing a plurality of memory cells arranged in a plurality of rows and a plurality of columns, each memory cell having a storage device and a selection device connected in series; providing a plurality of word lines, each word line corresponding to one of the plurality of rows; providing a plurality of bit lines, each bit line corresponding to one of the plurality of columns; providing a plurality of source lines, each source line corresponding to one of the plurality of columns; and connecting a first number of the plurality of source lines in parallel.

In accordance with further disclosed embodiments, a memory cell is provided. The memory cell includes: a storage device being selectable between a first resistance state and a second resistance state in response to a bit line signal; and a transistor connected in series with the storage device, the transistor being configured to provide access to the storage device in response to a word line signal at a gate of the transistor; and a plurality of source lines connected to the transistor, wherein the plurality of source lines are connected in parallel with one another.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory cell array having a plurality of memory cells arranged in a plurality of rows and a plurality of columns, each row of memory cells being associated with a word line, each column of memory cells being associated with a bit line and a source line, wherein each memory cell comprises:
a storage device coupled to the bit line, the storage device being selectable between a first resistance state and a second resistance state in response to a bit line signal at the bit line; and a selection device connected in series with the storage device and coupled to the source line, the selection device being configured to provide access to the storage device in response to a word line signal at the word line;

a word-line driver coupled to the word line and configured to generate the word line signal;

a bit-line driver coupled to the bit line and configured to generate the bit line signal; and wherein corresponding source lines for the each column of memory cells are electrically connected in parallel through one or more metal contacts that extend perpendicular to the source lines.

2. The memory device of claim 1, wherein the bit line is a first metal track and the source line is a second metal track.

3. The memory device of claim 2, wherein the second metal track is below the first metal track.

4. The memory device of claim 2, wherein the first metal track has a first sheet resistance and the second metal track has a second sheet resistance, and a first number of the source lines is determined based on the first sheet resistance and the second sheet resistance.

5. The memory device of claim 4, wherein the first number of the source lines is determined to be the greatest integer less than or equal to a ratio of the second sheet resistance to the first sheet resistance.

6. The memory device of claim 2, wherein a first number of the source lines are connected in parallel through a third metal contact track below the first number of source lines.

7. The memory device of claim 2, wherein a first number of the source lines are connected in parallel through a third metal track above the first number of source lines.

8. The memory device of claim 1, wherein a first number of the source lines are in columns adjacent to each other.

9. The memory device of claim 1, wherein a first number of the source lines are in columns not all adjacent to each other.

10. The memory device of claim 1, wherein the storage device is a magnetic tunnel junction (MTJ), the first resistance state is a high resistance state, and the second resistance state is a low resistance state.

11. The memory device of claim 1, wherein the selection device is a transistor with a gate coupled to the word line.

12. A memory cell, comprising:
a storage device being selectable between a first resistance state and a second resistance state in response to a bit line signal; and
a transistor connected in series with the storage device, the transistor being configured to provide access to the storage device in response to a word line signal at a gate of the transistor; and
a plurality of source lines connected to the transistor, wherein corresponding source lines for the each column of memory cells are electrically connected in parallel through one or more metal contacts that extend perpendicular to the source lines.

13. The memory cell of claim 12, further comprising:
a bit line coupled to the storage device, wherein the bit line comprises a first metal track; and
wherein the plurality of source lines comprises a plurality of second metal tracks connected in parallel.

14. The memory cell of claim 13, wherein the first metal track has a first sheet resistance and the second metal track has a second sheet resistance, the plurality of source lines comprise a first number of source lines determined based on the first sheet resistance and the second sheet resistance.

15. The memory cell of claim 12, wherein the plurality of source lines are connected in parallel by a metal contact track below the plurality of source lines.

16. The memory cell of claim 12, wherein the plurality of source lines are connected in parallel by a third metal track above the plurality of source lines.

17. A method, comprising:
providing a memory cell array having a plurality of memory cells arranged in a plurality of rows and a plurality of columns, each row of memory cells being associated with a word line, each column of memory cells being associated with a bit line and a source line, wherein each memory cell comprises:
a storage device coupled to the bit line, the storage device being selectable between a first resistance state and a second resistance state in response to a bit line signal at the bit line; and
a selection device connected in series with the storage device and coupled to the source line, the selection device being configured to provide access to the storage device in response to a word line signal at the word line;
coupling a word-line driver to the word line to generate the word line signal;
coupling a bit-line driver the bit line to generate the bit line signal; and
electrically connecting corresponding source lines for the each column of memory cells in parallel through one or more metal contacts that extend perpendicular to the source lines.

18. The method of claim 17, wherein the bit line is a first metal track and the source line is a second metal track, wherein the first metal track has a first sheet resistance and the second metal track has a second sheet resistance, and wherein the method further comprises:
determining a first number of the source lines based on the first sheet resistance and the second sheet resistance.

19. The method of claim 17, wherein the one or more metal contacts are below the corresponding source lines.

20. The method of claim 17, wherein the one or more metal contacts are above the corresponding source lines.

* * * * *